United States Patent [19]

Cicso

[11] Patent Number: 4,902,990
[45] Date of Patent: Feb. 20, 1990

[54] THICK FILM MICROWAVE COUPLER

[75] Inventor: Terry C. Cicso, Glendale, Calif.

[73] Assignee: Hughes Aircraft Company, Los Angeles, Calif.

[21] Appl. No.: 249,136

[22] Filed: Sep. 26, 1988

[51] Int. Cl.$^4$ ............................................. H01P 5/18
[52] U.S. Cl. ..................................... 333/116; 333/238
[58] Field of Search ............... 333/112, 114, 116, 246, 333/238

[56] References Cited

U.S. PATENT DOCUMENTS

| | | | |
|---|---|---|---|
| 3,440,570 | 4/1969 | Kasper | 333/116 |
| 3,512,110 | 5/1970 | Clar | 333/116 |
| 3,768,042 | 10/1973 | Friend et al. | 333/116 |
| 4,383,227 | 5/1983 | de Ronde | 333/238 X |

FOREIGN PATENT DOCUMENTS 0004306  1/1985  Japan ................................... 333/116

Primary Examiner—Eugene R. Laroche
Assistant Examiner—Seung Ham
Attorney, Agent, or Firm—Leonard A. Alkov; W. K. Denson-Low

[57] ABSTRACT

A microwave coupler including a first transmission line having one or more strip sections, and a second transmission line having one or more strip sections respectively associated with corresponding sections of the first transmission so as to form associated pairs of coupled strip sections. The associated coupled strip sections are substantially uniformly separated from each other and non-coplanar. Dielectric material dielectrically separates the associated strip sections of the first and second transmission lines.

10 Claims, 3 Drawing Sheets

THICK FILM MICROWAVE COUPLER

BACKGROUND OF THE INVENTION

The disclosed invention generally relates to a microwave stripline coupler, and is more particularly directed to a microstrip coupler structure which can be made with processes having loose tolerances including thick film and low temperature co-fired processes.

Microstrip couplers are 4-port microwave integrated circuit elements utilized for directing microwave energy. In a very basic form, a microstrip coupler comprises two closely spaced, edge by edge parallel microstrip transmission lines having a common ground plane. The ends of one of the microstrips comprise an incident port and a direct port, while the ends of the other comprise a coupled port and an isolated port, with the coupled port being next to the incident port. Ideally, microwave power applied to the incident port is directed to the direct port and the coupled port only, but in practice some power is coupled to the isolated port. The relative amount of power available at the coupled port can be characterized by coupled port insertion loss, wherein a numerically greater dB figure means less power is coupled to the coupled port, which is achieved by a greater spacing between the microstrips. Thus, a coupler characterized by 10 dB of coupling has a greater separation between the microstrips than a coupler having 3 dB of coupling; and the 10 dB coupler couples less power to the coupled port than the 3 dB coupler.

Microstrip couplers are designed with different coupled port losses for different applications. An important coupler is the 3 dB coupler which divides the incident power so that half is available at the direct port and half at the coupled port.

Microwave circuit elements, particularly those designed for shorter wavelengths, are small and therefore candidates for integrated circuit manufacturing techniques. As to parallel microstrip couplers, however, the close separation and stringent tolerances required for tight coupling are not readily achieved with photolithographic techniques. Other more complex structures have been devised for implementation with photolithographic techniques, including an interdigited coupler (sometimes called a Lange coupler after its originator) which includes three or more parallel transmission lines, wherein non-adjacent lines are connected in parallel at their respective ends, and sometimes additionally at the centers of the lines, by wire bonds or conductive bridges.

Important considerations with the interdigited coupler structure include complex manufacturing procedures, low yield, wire bonding labor and size. Moreover, it is not amenable to the reduced tolerances of thick film processing techniques which can be utilized to produce other microwave circuit elements at significantly lower cost.

SUMMARY OF THE INVENTION

It would therefore be an advantage to provide a microwave coupling structure that provides tight coupling and is reliably and consistently produced.

Another advantage would be to provide a microwave coupling structure that provides tight coupling and is reliably and consistently produced with processes having loose tolerances.

The foregoing and other advantages are provided by the invention in a microwave coupling structure that includes a first transmission line having one or more strip sections, and a second transmission line having one or more strip sections respectively associated with corresponding sections of the first transmission line so as to form associated pairs of coupled strip sections. The associated strip sections are substantially uniformly separated from each other and non-coplanar. Dielectric material dielectrically separates the associated strips sections of the first and second transmission lines.

BRIEF DESCRIPTION OF THE DRAWING

The advantages and features of the disclosed invention will readily be appreciated by persons skilled in the art from the following detailed description when read in conjunction with the drawing wherein.

DETAILED DESCRIPTION

Figure 1:
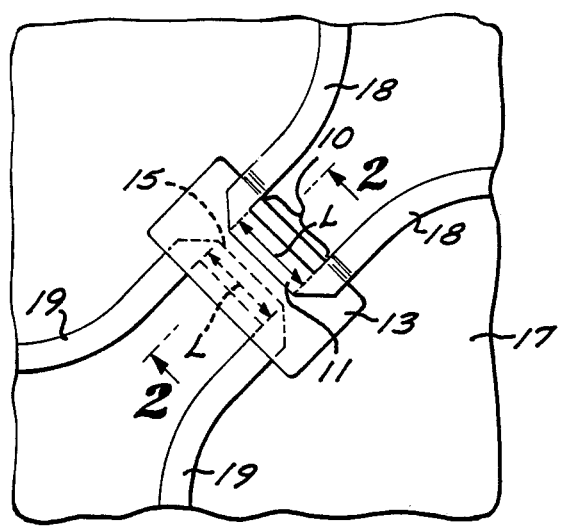
FIG. 1 is a schematic top plan view of a microwave coupler in accordance with the invention together with connecting transmission lines.

In the following detailed description and in the several figures of the drawing, like elements are identified with like reference numerals.

Figure 2:
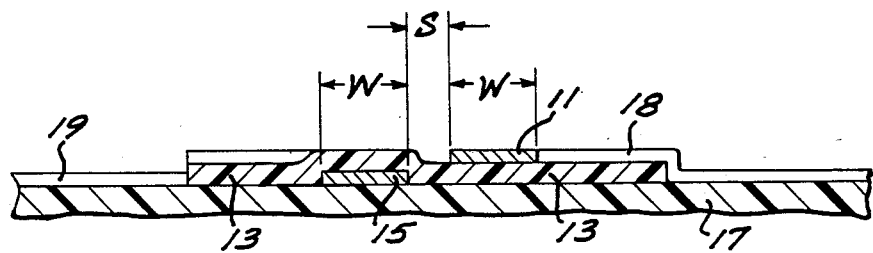
FIG. 2 is a schematic sectional view of the microwave coupler of FIG. 1 configured for loose coupling.

Referring now to FIGS. 1 and 2, a microwave coupler 10 in accordance with the invention includes a top elongated, generally rectangular, conductive strip 11 which is supported by a dielectric layer 13. The top conductive strip 11 can comprise an appropriate high conductivity metal such as gold or silver, and has a length L and a width W.

The microwave coupler 10 further includes a bottom elongated, generally rectangular, conductive strip 15 which separated from the top conductive strip 11 by the dielectric layer 13. The bottom conductive strip 15 can comprise the same metal as the top conductive strip 11, and is of the same length L and width W. The bottom elongated conductive strip 15 is parallel to and aligned with the top elongated conductive strip 11, whereby the conductive strips 11, 15 are uniformly separated along their lengths. Thus, the conductive strips 11, 15 are lengthwise or longitudinally adjacent, and are laterally aligned.

The length L of the strips 11, 15 would be typically one-fourth of the propagating wavelength at the center frequency of interest, or odd multiples of one-fourth of the propagating wavelength of interest. The width W is chosen to provide minimum reflected signal.

The coupler 10 is supported on a dielectric substrate 17, comprising alumina or gallium arsenide (GaAs) for example, which could also support other elements of a microwave integrated circuit (MIC) or a monolithic microwave integrated circuit (MMIC). An appropriate conductive ground plane (not shown) would be disposed, for example, along the bottom of the support substrate 17.

The four ends of the elongated conductive strips 11, 15 of the coupler 10 form the four ports thereof, and are accessed by respective microstrip lines 18, 19. Specifically, the ends of the elongated conductive strip 11 are accessed by microstrip lines 18 disposed on the dielectric layer 13 and on the support substrate 17, while the ends of the elongated conductive strip 15 are accessed by microstrip lines 18 disposed on the dielectric layer 17 and extending beneath the dielectric layer 13.

Figure 3:
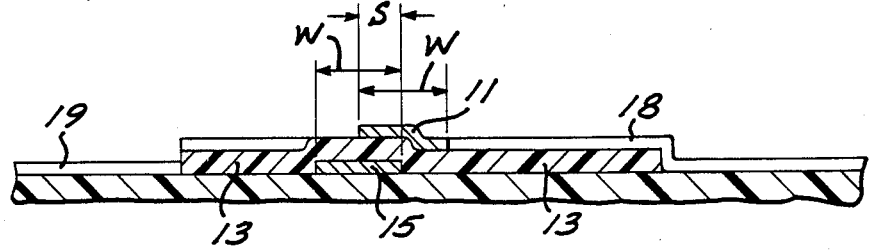
FIG. 3 is a schematic sectional view of the microwave coupler of FIG. 1 configured for tight coupling.

As shown in FIGS. 2 and 3, the lateral separation between the elongated conductive strips 11, 15 can be non-overlapping or partially overlapping. To provide a quantitative measure S of the lateral separation, S is equal to zero when the adjacent edges are vertically aligned and is equal to the negated value of the actual lateral separation between non-overlapping edges. For overlapping edges, the lateral separation S is equal to the amount of overlap. Thus, the lateral separation S is a negative number for non-overlapping configurations, and is a positive number for overlapping configurations. Since the amount of coupling increases as the conductive strips are brought closer together, the coupling provided increases with increasing value of the lateral separation S.

Figure 4:
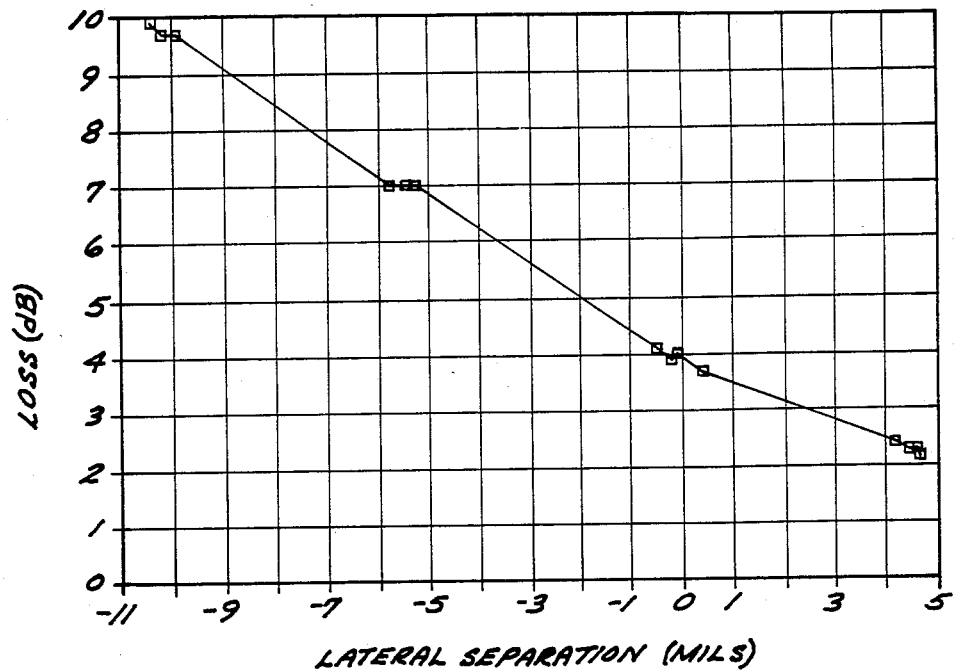
FIG. 4 is a plot of measured coupled port insertion loss versus lateral separation for certain couplers made in accordance with the invention.

FIG. 4 sets forth a plot of measured coupled port insertion loss versus measured lateral separation S for sixteen different couplers of the embodiment of FIG. 1 which were made with known thick film techniques to nominal lateral separations S of $-10.0$, $-5.0$, 0.0, and 5 mils.

Regardless of the lateral separation S, the coupled conductive strips 11, 15 are not coplanar. Moreover, the conductive strips 11, 15 do not have to be completely planar, as shown in FIG. 3, wherein the top conductive strip 11 overlaps the bottom conductive strip 15 and conforms to a raised portion of the dielectric layer 13 over the bottom conductive strip. It should be appreciated that the dielectric layer 13 can have a generally planar top portion, in which case the top conductive strip 11 will be generally planar at all values of the lateral separation S.

It should be noted that the different parts of the coupler 10 of FIG. 1 have different dielectric characteristics, which might be compensated, for example, by having elongated strips of different widths. A further embodiment of the invention shown in FIG. 5 is a variation of the coupler of FIG. 1 and provides ports having symmetrical dielectric characteristics.

Figure 5:
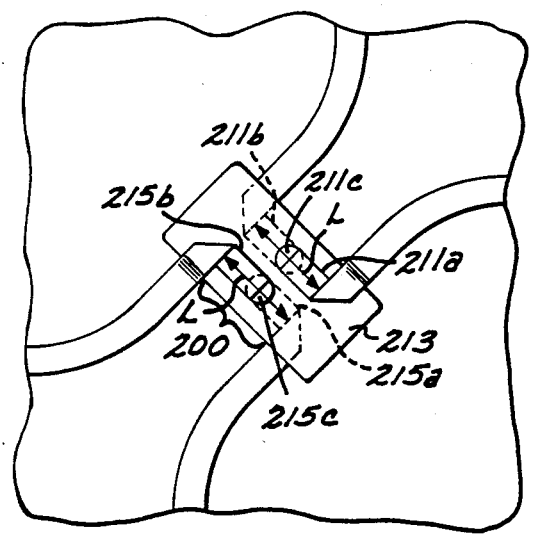
FIG. 5 is a schematic top plan view of another microwave coupler in accordance with the invention which is a variation of the coupler of FIG. 1.

Referring specifically to FIG. 5, shown therein is a coupler 200 which includes an elongated conductive strip 211 having a first linear section 211a on top of a dielectric electric layer 213 and a second linear section 211b beneath the dielectric layer 213. The first and second sections of the conductive strip 211 are connected by a via 211c which has a thickness that is sufficiently small to be electrically short (i.e., it does not function as a transmission line). The sections 211a, 211b are of equal length which is chosen such that the sum of the lengths is generally one-fourth of the propagating wavelength at the center frequency of interest or an odd multiple of one-fourth of the propagation wavelength of interest.

The coupler 200 further includes an elongated conductive strip 215 having a first linear section 215a beneath the dielectric layer 213 and a second linear section 215b on top of the dielectric layer 213, which are connected by a via 215c. The lengths of the sections 215a, 215b are substantially the same as the sections 211a, 211b, and the thickness of the via 215c is sufficiently small so as to be electrically short (i.e., it does not behave as transmission lines).

The sections of the conductive strips 211, 215 are arranged such that the coupled first sections 211a, 215a are parallel and non-coplanar. Similarly, the coupled second sections 211b, 215b are also parallel and noncoplanar.

Figure 6:
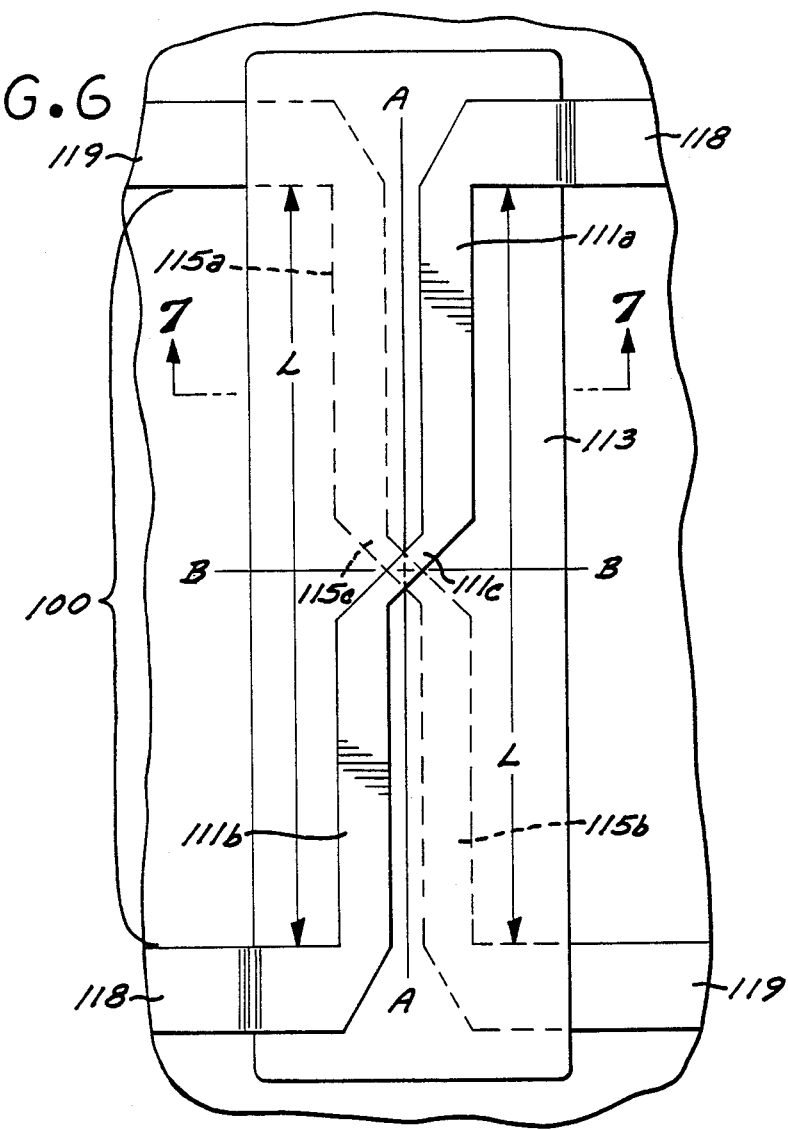
FIG. 6 is a schematic top plan view of a further microwave coupler in accordance with the invention together with connecting transmission lines.
Figure 7:
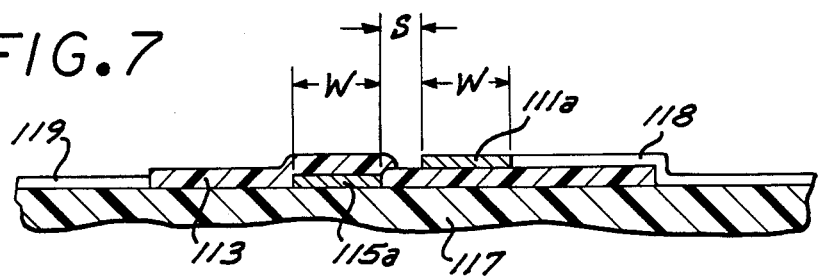
FIG. 7 is a schematic sectional view of the microwave coupler of FIG. 6.

Referring now to FIGS. 6 and 7, schematically illustrated therein is a further embodiment of the microwave coupler of the invention. The microwave coupler 100 includes a top conductive strip 111 of length L having first and second sections 111a, 111b connected by an intermediate conductive strip 111c. For symmetry, the second section 111b comprises the image of the first section 111a as mirrored about a longitudinal axis A and a lateral axis B which is orthogonal to the longitudinal axis A. The first and second sections 111a, 111b are generally rectangular conductive strips of width W and of equal length close to L/2, and are parallel and offset relative to each other in the direction of their lengths.

It should be appreciated by persons skilled in the art that, depending on bandwidth considerations, the length L is generally equal to one-fourth of the propagating wavelength at the center frequency of interest or odd multiples of one-fourth of the propagating wavelength of interest.

The length of the intermediate conductive strip 111c along its centerline is much less than 1/10 of the propagating wavelength of interest, so that it is essentially electrically short.

The coupler 100 further includes a lower elongated conductive strip 115 of length L having first and second sections 115a and 115b connected by an intermediate conductor 115c. The configuration of the lower elongated conductive strip 115 is achieved by rotating the top elongated conductor 111 180 degrees about the lateral axis B.

Thus, the first and second sections 115a, 115b of the bottom conductive strip 115 are also generally rectangular conductive strips of width W and equal length, and are parallel and offset relative to each other in the direction of their lengths. Further, the top and bottom conductive strips 111, 115 are longitudinally adjacent and laterally aligned. The respective first sections 111a, 115a are parallel, uniformly separated by a lateral separation, and non-coplanar. Similarly, the second sections 111b, 115b are parallel, uniformly separated by a lateral separation, and non-coplanar.

The length of the intermediate conductive strip 115c along its centerline is much less than 1/10 of the propagating wavelength of interest, so that it is essentially electrically short. Further, the intermediate conductive strips 111c, 115c are preferably at right angles to each other to reduce coupling between them.

As with the coupler 10 of FIG. 1, the lateral separation between corresponding first and second sections of the conductive strips 111, 115 can be quantitatively specified as the lateral separation S which can be negative (non-overlapping), zero (adjacent edges vertically aligned), or positive (overlapping adjacent edge portions). Since the coupling provided increases as the conductive strips 111, 115 are brought closer together, the coupling provided increases with increasing values of the lateral separation S.

The coupler 100 is supported on a dielectric substrate 117, comprising alumina or gallium arsenide (GaAs) for example, which could also support other elements of a microwave integrated circuit (MIC) or a monolithic microwave integrated circuit (MMIC). An appropriate conductive ground plane (not shown) would be disposed, for example, along the bottom of the support substrate 117.

The four ends of the elongated conductive strips 111, 115 of the coupler 100 form the four ports thereof, and are accessed by respective microstrip lines. Specifically, the ends of the conductive strip 111 are accessed by microstrips 118 which are disposed on the dielectric layer 113 and on the support substrate 117, while the ends of the conductive strip 115 are accessed by microstrips 119 which are disposed on the support substrate 117 and extend beneath the dielectric layer 113.

The microwave coupler 100 of FIGS. 6 and 7 functions in the same manner as the coupler 10 of FIGS. 1-3, but additionally provides the advantage of having the direct and coupled output ports on the same side. Thus, for example, if the lower left port as viewed in FIG. 4 is utilized as the incident port, the direct output port would be at the upper right while the coupled output port would be at the lower right. Such configuration of the output ports is particularly important in a group of circuits known as balanced structures which include for example balanced filters, balanced amplifiers, balanced phase shifters, and balanced attenuators.

In essence, the disclosed microwave coupling structure utilizes first and second transmission lines, each having one or more strip sections. Corresponding coupled sections of the first and second transmission lines are uniformly separated and non-coplanar. It should be appreciated that the sections of the first and second transmission lines can be other than linear, for example curved.

As a result of the non-coplanar coupled strip sections, the described microwave coupling structures do not require excessively strict tolerances and can be advantageously fabricated utilizing processes having loose tolerances, including thick film and low temperature co-fired processes for example, to consistently and reliably produce couplers, including tight coupling couplers such as 3 dB couplers, at low cost. For example, the conductive strips comprising the couplers would be formed pursuant to the silk screen patterning of conductive paste which is subsequently fired. The ability to use thick film techniques advantageously promotes the low cost manufacture of microwave integrated circuits wherein couplers, other transmission lines and passive elements (e.g., resistors and capacitors) are formed with thick film processing. U.S. Pat. No. 4,645,552 discloses thick film processing which may be appropriate utilized to produce the disclosed microwave coupling structure.

Although the foregoing has been a description and illustration of specific embodiments of the invention, various modifications and changes thereto can be made by persons skilled in the art without departing from the scope and spirit of the invention as defined by the following claims.

What is claimed is:

1. A microwave coupler comprising:
    a first conductive transmission line having one or more strip sections;
    a second conductive transmission line having one or more strip sections respectively associated with the sections of said first transmission line, wherein associated strip sections are substantially uniformly separated from each other and non-coplanar and thereby coupled;
    dielectric means for dielectrically separating associated strip sections of said first and second conductive transmission lines, wherein said dielectric means comprises a dielectric layer having first and second sides:
    said first conductive transmission line comprises a first strip on the first side of said dielectric layer and a second strip on the second side of said dielectric layer; and
    said second conductive transmission line comprises (a) a first strip on the second side of said dielectric layer uniformly separated from said first strip of said first transmission line and (b) a second strip on the first side of dielectric layer uniformly separated from said second strip of said first transmission line.

2. The microwave coupled of claim 1 wherein said first and second conductive transmission lines comprise first and second parallel linear conductive strips uniformly separated along adjacent edges.

3. The microwave coupled of claim 2 wherein the separation of the adjacent edges of said first and second linear conductive strips is overlapping or non-overlapping, depending upon the required coupling.

4. The microwave coupler of claim 1 wherein said first strips of said first and second transmission lines comprise parallel linear strips uniformly separated along adjacent edges, and wherein said second strips of said first and second transmission lines comprise parallel linear strips uniformly separated along adjacent edges.

5. The microwave coupler of claim 4 wherein the separation between said first strips is substantially the same as the separation between said second strips.

6. The microwave coupler of claim 5 wherein the separation between adjacent edges of corresponding first and second sections is overlapping or non-overlapping, depending upon the required coupling.

7. A microwave coupler comprising:
    a first elongated conductor;
    a second elongated conductor longitudinally adjacent and dielectrically separated from said first elongated conductor and having its ends aligned with the ends of said first elongated conductor, said first and second elongated conductors being non-coplanar;
    a dielectric layer interposed between said first and second elongated conductors for electromagnetically coupling said first and second elongated conductors, wherein said dielectric layer has first and second sides;
    said first elongated conductor comprises a first portion on the first side of said dielectric layer and a second portion on the second side of said dielectric layer; and
    said second elongated conductor comprises (a) a first portion on the second side of said dielectric layer uniformly separated from said first portion of said first elongated conductor and (b) a second portion on the first side of dielectric layer uniformly separated from said second portion of said first elongated conductor.

8. The microwave coupler of claim 7 wherein said first and second elongated conductors can be partially overlapping or non-overlapping, depending upon the required coupling.

9. A microwave coupler comprising:

a first transmission line having first and second conductive strips;

a second transmission line having first and second conductive strips respectively associated with said first and second conductive strips of said first transmission line, said first conductive strips being uniformly separated from each other and being non-coplanar, said second conductive strips being uniformly separated from each other and being non-coplanar;

dielectric means for dielectrically separating said first conductive strips and for dielectrically separating said second conductive strips;

said dielectric means comprises a dielectric layer having first and second sides;

said first conductive strip of said first transmission line and said second conductive strip of said second transmission lines is on the first side of said dielectric layer; and said second conductive strip of said first transmission line and said first conductive strip of said second transmission line is on the second side of said dielectric layer.

10. The microwave coupler of claim 9 wherein said first conductive strips are linear and parallel, and wherein said second conductive strips are linear and parallel.

* * * * *